United States Patent [19]

Foster

[11] Patent Number: 4,510,686

[45] Date of Patent: Apr. 16, 1985

[54] METHOD AND APPARATUS FOR STRAIGHTENING AND ALIGNING LEADS AND TESTING ELECTRICAL FUNCTIONING OF COMPONENTS

[75] Inventor: James E. Foster, Endwell, N.Y.

[73] Assignee: Universal Instruments Corporation, Binghamton, N.Y.

[21] Appl. No.: 483,700

[22] Filed: Apr. 11, 1983

[51] Int. Cl.³ .................. H05K 3/30; B23P 19/00; B21F 1/07

[52] U.S. Cl. .................... 29/838; 29/741; 29/407; 29/705; 29/759; 140/147

[58] Field of Search ............. 29/834, 407, 825, 705, 29/838, 741, 759; 140/147

[56] References Cited

U.S. PATENT DOCUMENTS

| | | | |
|---|---|---|---|
| 3,106,945 | 10/1963 | Wright et al. | 140/147 |
| 3,220,443 | 11/1965 | Smith et al. | 140/147 |
| 3,447,224 | 6/1969 | Helda | 140/147 |
| 3,520,336 | 7/1970 | Zemek | 140/147 |
| 3,605,234 | 9/1971 | Bogursky . | |
| 3,664,016 | 5/1972 | Sevc et al. . | |
| 3,777,350 | 12/1973 | Maeda et al. | 29/739 X |
| 4,068,170 | 1/1978 | Chayka et al. | 339/74 R X |
| 4,094,410 | 6/1978 | Fegley et al. | 198/345 X |
| 4,286,380 | 9/1981 | Blount | 29/741 |
| 4,287,668 | 9/1981 | Asai et al. | 29/838 |
| 4,327,483 | 5/1982 | Zemek et al. | 29/759 X |

*Primary Examiner*—Mark Rosenbaum
*Assistant Examiner*—Carl J. Arbes
*Attorney, Agent, or Firm*—Fidelman, Wolffe & Waldron

[57] ABSTRACT

A method and apparatus is disclosed for handling single in-line packaged (SIP) components wherein the components are individually selected from a plurality of magazine supplies, transported to a gauging station at which the leads thereof are straightened and aligned and electrical functioning of the component is tested, and transferred from the gauging station to an insert station at which the leads thereof are inserted into corresponding holes of a printed circuit board.

14 Claims, 18 Drawing Figures

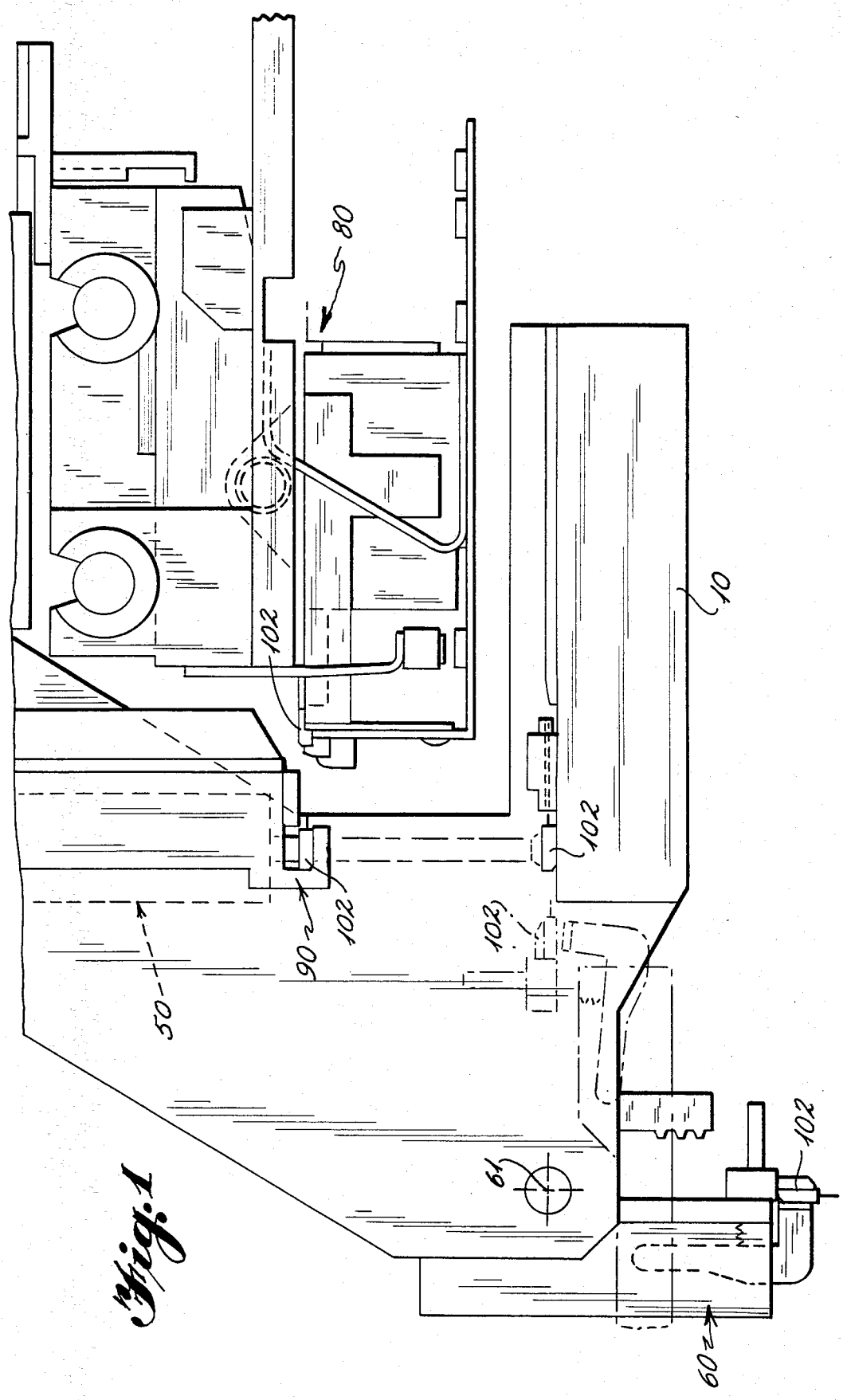

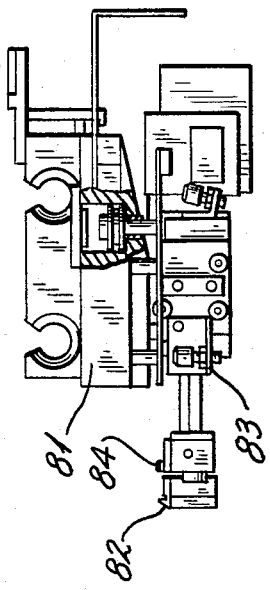
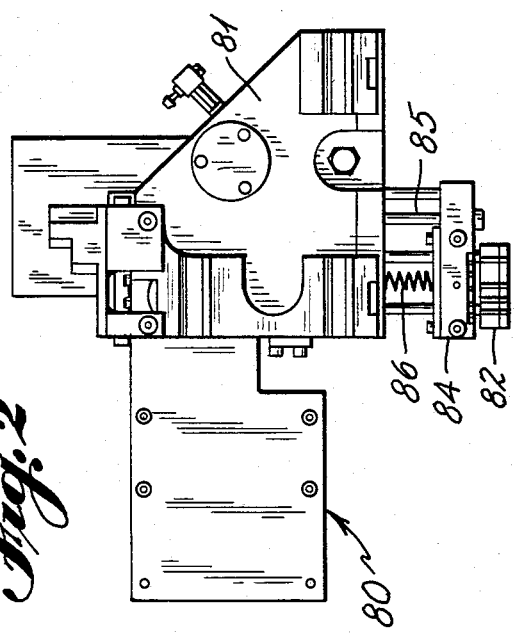
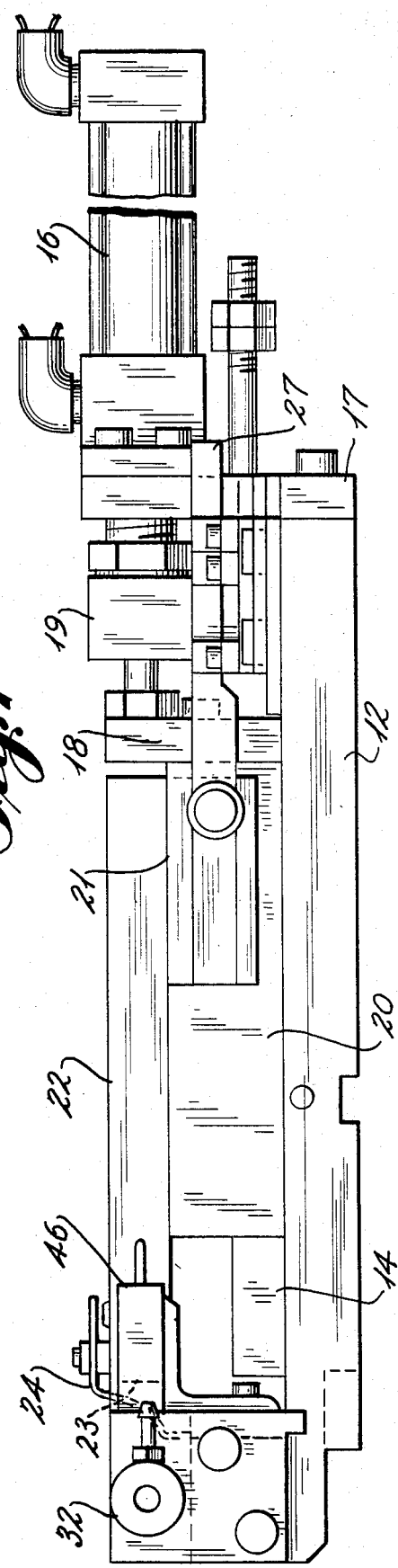

Fig. 4
Fig. 5
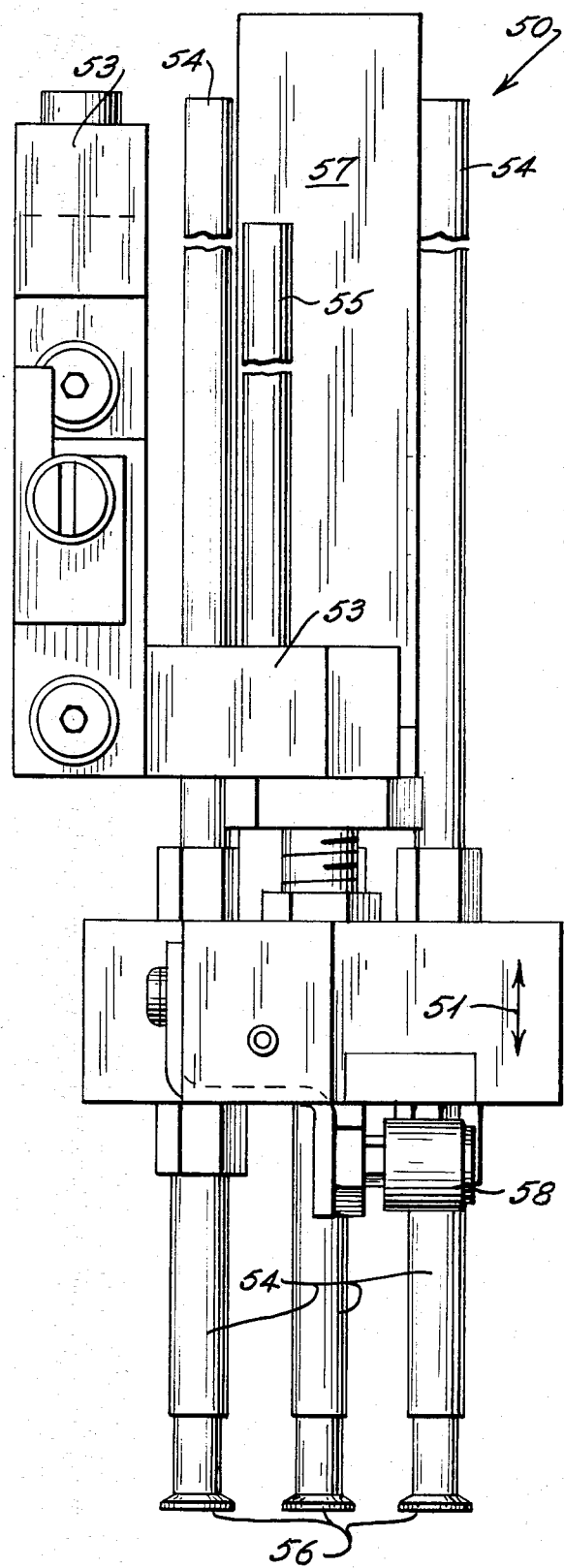
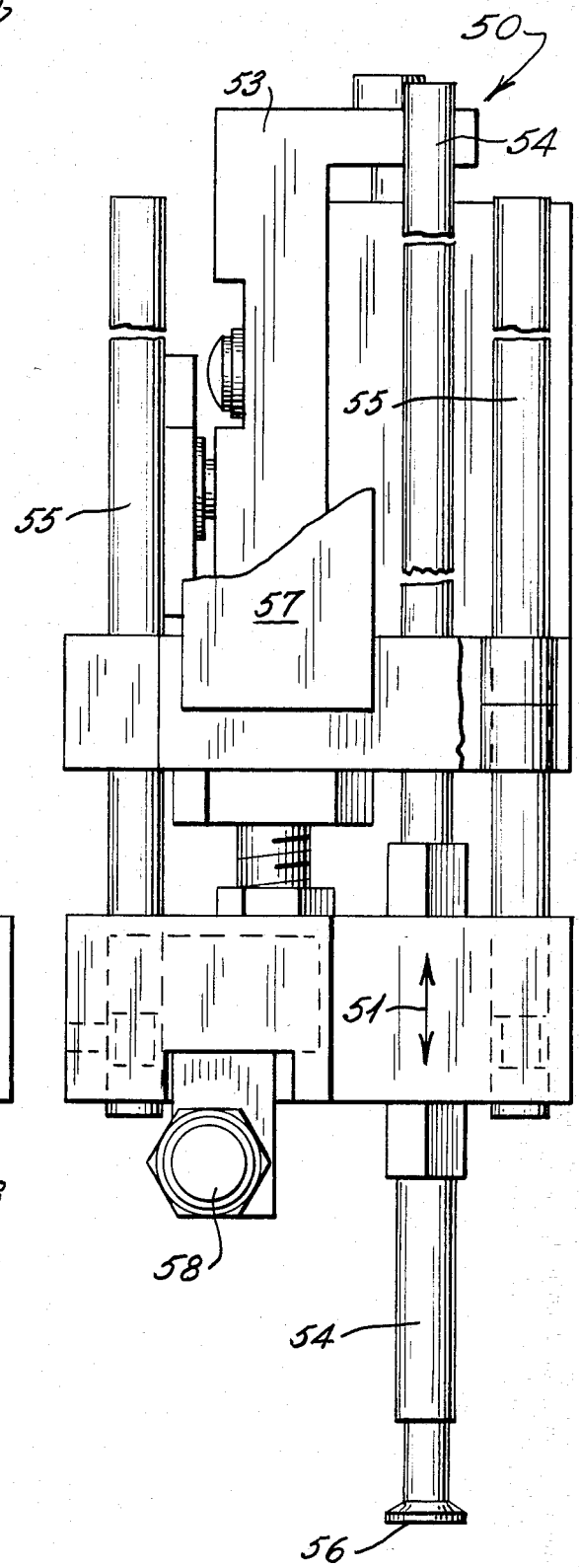

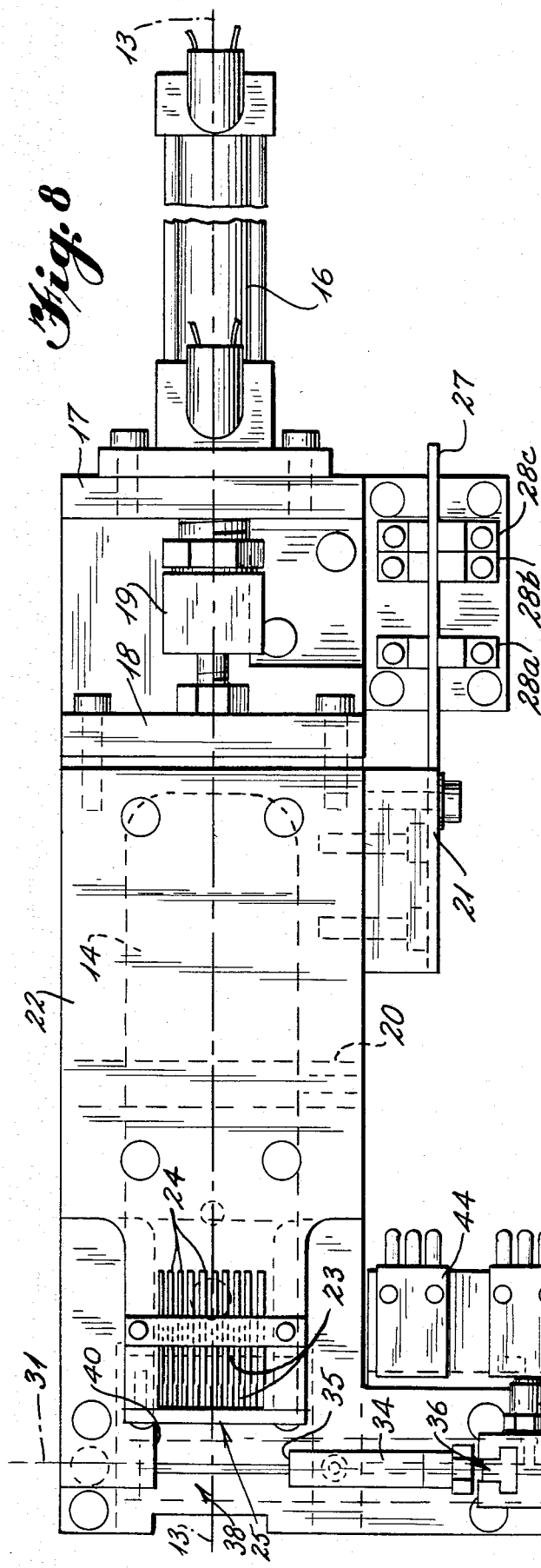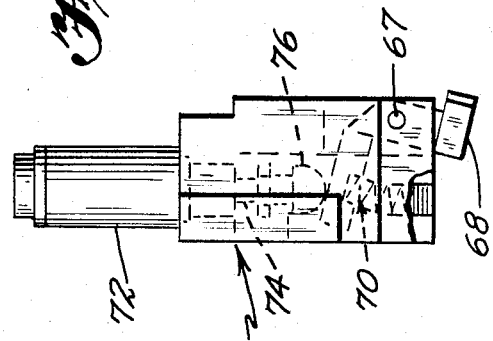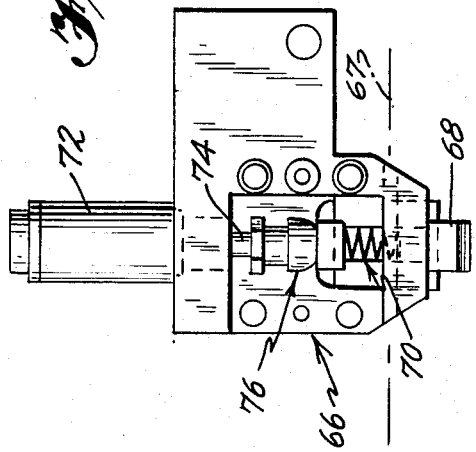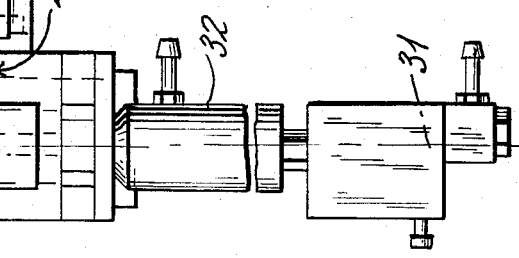

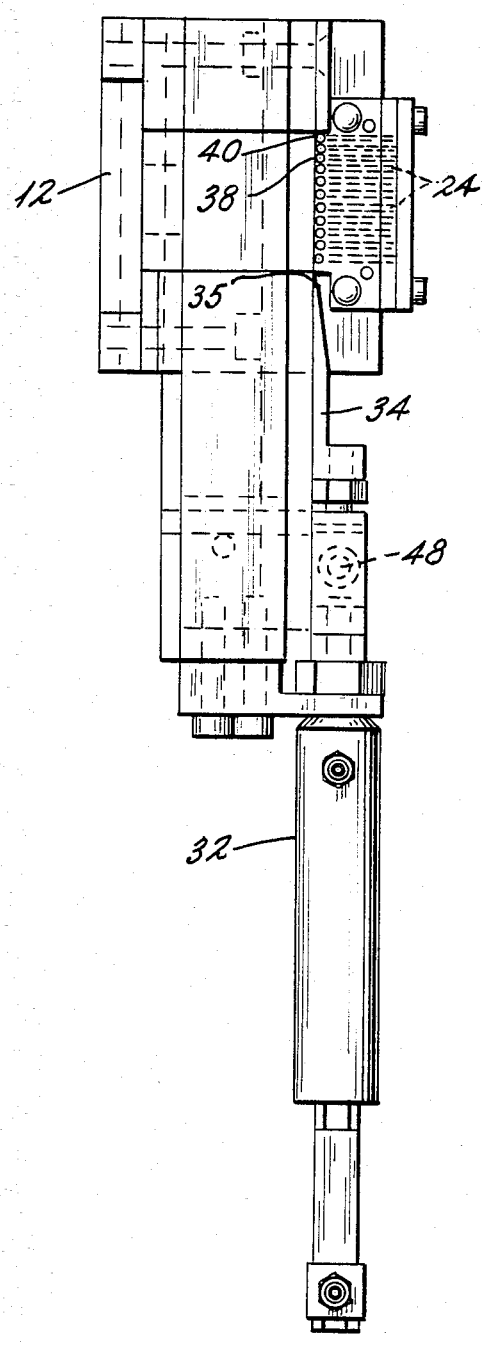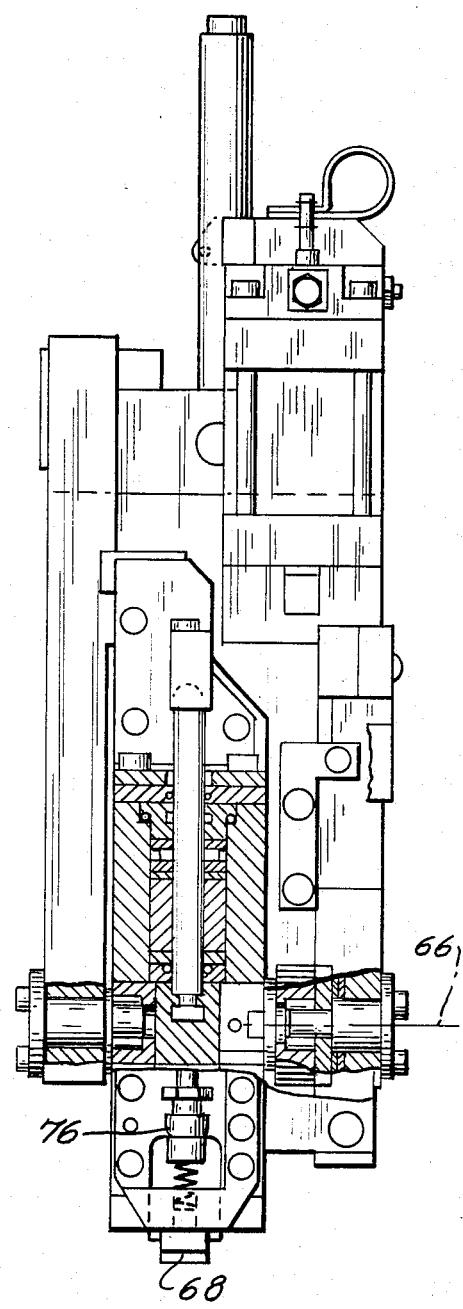

METHOD AND APPARATUS FOR STRAIGHTENING AND ALIGNING LEADS AND TESTING ELECTRICAL FUNCTIONING OF COMPONENTS

CROSS-REFERENCES TO THE PRIOR ART

U.S. Pat. No. 4,367,584—Method and Apparatus for Straightening Leads and Verifying the Orientation and Functionality of Components—Janisiewicz, et al., issued Jan. 11, 1983.

U.S. Pat. No. 4,327,483—Apparatus for Selecting, Transporting, and Inserting Single In-line Components—Zemek, et al., issued May 4, 1982.

U.S. Pat. No. 4,068,170—Method and Apparatus for Contacting the Lead of an Article—Chayka, et al., issued Jan. 10, 1978.

BACKGROUND AND SUMMARY OF THE INVENTION

This invention relates to a method and apparatus for handling single in-line (SIP) components. Such components have a generally parallelepiped body and a single series of in-line leads protruding from one surface of the body. Although particularly directed to handling of SIP components, it is contemplated that certain facets of the disclosure are applicable to other types of components.

The above-referenced U.S. Pat. No. 4,327,483 discloses an apparatus for sequentially selecting and transporting SIP components and inserting them into a printed circuit board and the disclosure thereof is incorporated herein by reference. During handling, the leads of such components easily can be bent relative to a nominal axis for each lead, causing the subsequent misinsertion of the leads into corresponding holes of the circuit board. Further, there is a need for automated handling of such components in which testing of electrical functioning of these components is performed during the handling. The above referenced U.S. Pat. No. 4,367,584 discloses straightening leads and testing electrical functioning of dual in-line packaged (DIP) components. However, the method and apparatus for doing so is not readily adaptable to SIP-type components.

Accordingly, it is an object of the instant invention to provide an automated means for straightening leads which are bent along their axes particularly the leads of SIP-type components.

It is a further object of this invention to align the axes of leads of a component, whether or not the leads are perpendicular to the surface from which they protrude, in order to align tips of the leads and provide references for locating these tips for subsequent insertion into corresponding holes of a printed circuit board.

It is an additional object of this invention to sense the presence and absence of straightened leads in order to determine whether or not such a component is physically acceptable for insertion into circuit board.

Further, it is an object of this invention to provide for testing of the circuitry of the component, either statically or dynamically, to ascertain electrical acceptability of the component.

These and other objects of the invention will become apparent with reference to the following disclosure.

In a preferred embodiment of the invention, selected components are sequentially transferred from a plurality of supply magazines by a shuttle assembly and transported to a shuttle unload station at which a vertical transfer assembly transfers the components from the shuttle assembly to a gauging station. At the gauging station, the component is clamped to secure it and to locate the leads for subsequent engaging thereof. During the gauging operation, bent leads of the component are straightened and electrical functioning of the component is tested. Thereafter, the body of the component is sandwiched between a movable gauge block and an insert head vacuum block for transfer of the component from the testing station, after which the component is clamped onto the vacuum block and the gauging block is retracted. The clamping assembly allows retraction of the gauging block without dislodging the component from the vacuum block and also allows a rotation of the vacuum block to an insert position without loss of the component due to inertia or the like. Subsequent thereto, the component is mounted on a printed circuit board by inserting the leads thereof into corresponding holes of the circuit board.

This process is repeated until all the needed components have been inserted into the circuit board, whereupon another board is placed on a pantograph and the cycle is started over.

BRIEF DESCRIPTION OF THE DRAWINGS

FIG. 1 is a schematic, side elevation illustrating the positioning of the various main assemblies relative to each other during handling of a SIP.

FIG. 2 is a top plan view of a shuttle assembly.

FIG. 3 is a right side elevation of the shuttle assembly of FIG. 2.

FIG. 4 is a front elevational view of a vertical transfer assembly.

FIG. 5 is a right side elevation of the device of FIG. 4.

FIG. 7 is a right side elevation of a lead straightener/function verifier assembly.

FIG. 8 is a top plan view of the device of FIG. 7.

FIG. 9 is a front elevation of the device of FIG. 7

FIG. 10 is a front elevation of the insert head assembly partially in section and with parts thereof broken away for clarity.

FIG. 12 is a front elevation of the clamp assembly portion of the insert head assembly.

FIG. 13 is a right side elevation of the device of FIG. 12.

DETAILED DESCRIPTION OF THE INVENTION

Figure 14:
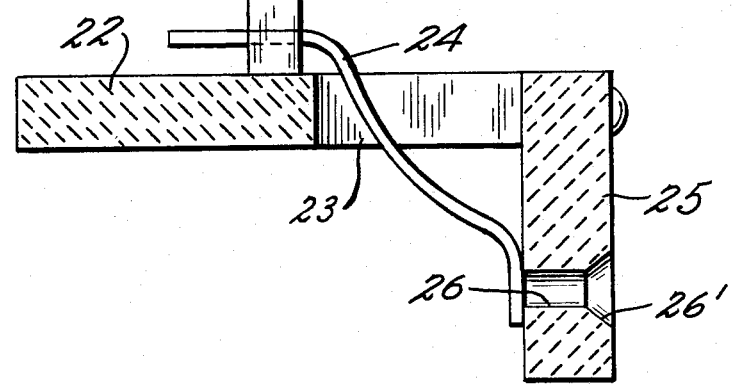
FIG. 14 is an enlarged, partial cross-section illustrating the lead straightener holes and verifier electrical contacts.
Figure 15:
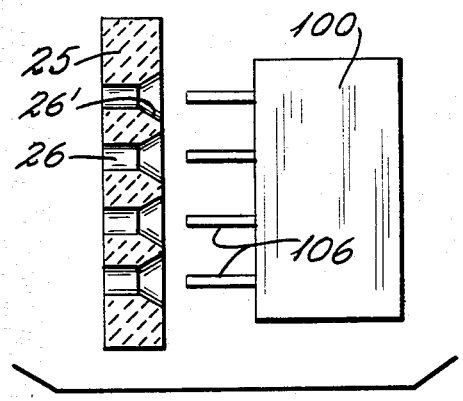
FIG. 15 is a cross-sectional view illustrating tapered entrances to the lead straightener holes.
Figure 16:
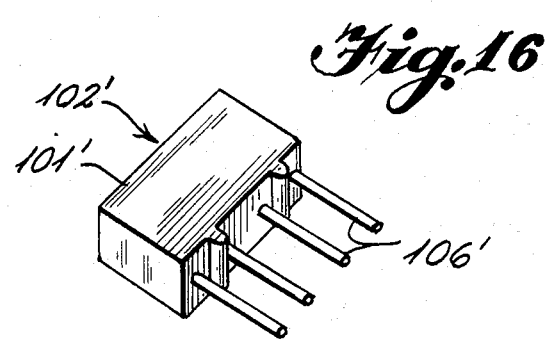
FIGS. 16 and 17 are perspective views of SIP components.
Figure 17:
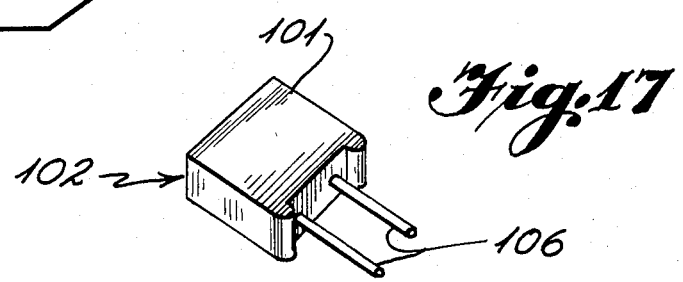

• Referring to FIGS. 7-9, a piston-cylinder 16 is attached to reciprocating slide 20, via floating coupling 19 and bracket 18 for extension and reaction along axis 13. Slide 20 has an electrically insulative block 22 attached to the top thereof and straddles a fixed, center guide 14. Center guide 14 is attached to a fixed base plate 12, to which cylinder 16 is also affixed via bracket 17. A front end of insulative block 22 is provided with slots 23 (as seen in FIG. 8) and a lead straightener block 25. Slots 23 are for reception of flexible electrical contacts 24 (FIGS. 7 and 14) which are biased against the back of holes 26 of straightener block 25 as seen in FIG. 14. A photocell sensor arrangement 28A, 28B, 28C is attached to frame 12 for sensing three different positions of extension or retraction of slide 20. To facilitate such sensing, a vane 27 has apertures (not shown) appropriately arranged along the length thereof and is attached to slide 20 by bracket 21. The front (to the left in FIGS. 7 and 8) of frame 12 has a clamping cylinder 32 attached thereto for reciprocation of a clamp block 34 along axis 31 of FIG. 8. Clamp block 34 slides on a horizontal surface 38 to clamp a component between the front surface 35 of clamp block 34 and locator surface 40 in opposition thereto, as will be explained further. A magnet 48 (FIG. 8) is reciprocatable with clamp block 34 and cooperates with Hall effect sensors 44 and 46 to detect the extended and retracted positions of clamp block 34.

Referring further to FIGS. 14–17, lead straightening-/aligning block 25 has a series of holes 26 with conical-shaped lead-in portions 26' for receiving and guiding leads into holes 26 such that the tips of the leads of a component 100 will engage flexible leaf-spring contacts 24 in order that a test function may be performed; and block 25 is electrically insulated by a coating or by forming it from a ceramic, plastic, or the like. With this arrangement, the leads are straightened, or at least aligned parallel to each other so that contact of the tips of the leads with electrical contacts 24 allows the sensing of the presence and absence of the various leads as well as testing of the electrical functioning of component 100 via a connection between electrical contacts 24 and a controller (not shown). The controller typically may comprise a programmable computer.

Figure 6:
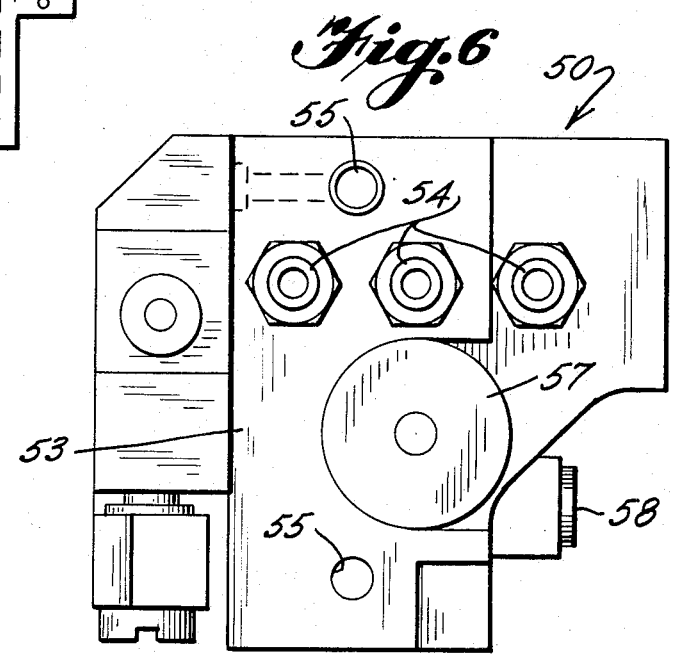
FIG. 6 is a top plan view of the device of FIG. 4.

Located above horizontal surface 38 is a vertical transfer assembly 50 as schematically illustrated in FIG. 1. The structure of vertical transfer assembly 50 may be seen in FIGS. 4–6 in which a bracket 53 is attached to a cylinder 57 to support it on a machine frame such as a typical C-frame. Accordingly, cylinder 57 is fixed relative to the machine frame and actuation thereof provides for a vertical reciprocation of vacuum tubes 54 in the direction of arrows 51. The top ends of tubes 54 are connected to vacuum supply hoses (not shown) in a well known manner, and the bottom ends of tubes 54 have the typical flexible tips attached thereto. Guide rods 55 ensure proper reciprocation of vacuum tubes 54 relative to bracket 53 under the control of cylinder 57. A magnet 58 cooperates with a pair of Hall effect sensors to indicate the extended and retracted positions of tubes 54.

FIGS. 2 and 3 illustrate a Shuttle assembly 80 (similar to that disclosed in the above referenced U.S. Pat. No. 4,327,483) for pick-up of the SIP components 100 from a selected magazine 90 (shown schematically in FIG. 1) and transport thereof to vertical transfer assembly 50. A general functioning of Shuttle assembly 80 is well illustrated and explained in the above cross-reference U.S. Pat. No. 4,327,483 and comprises a main body 81 to which is pivotally attached an arm 83 having an extensible and retractable clamp assembly comprising a retriever 82 and a clamp 84. Extension of clamp 84 is limited by a guide bolt 85 threaded into body 81 such that a spring 86 biases clamp 84 to its fully extended position. Retriever 82 is extensible and retractable relative to body 81 via a well known piston/cylinder arrangement. Extension of retriever 82 further than that shown in FIGS. 2 and 3 opens the clamp assembly for reception of a SIP and, during retraction thereof, the SIP is sandwiched or clamped between retriever 82 and clamp 84 under the bias of the spring 86.

Figure 11:
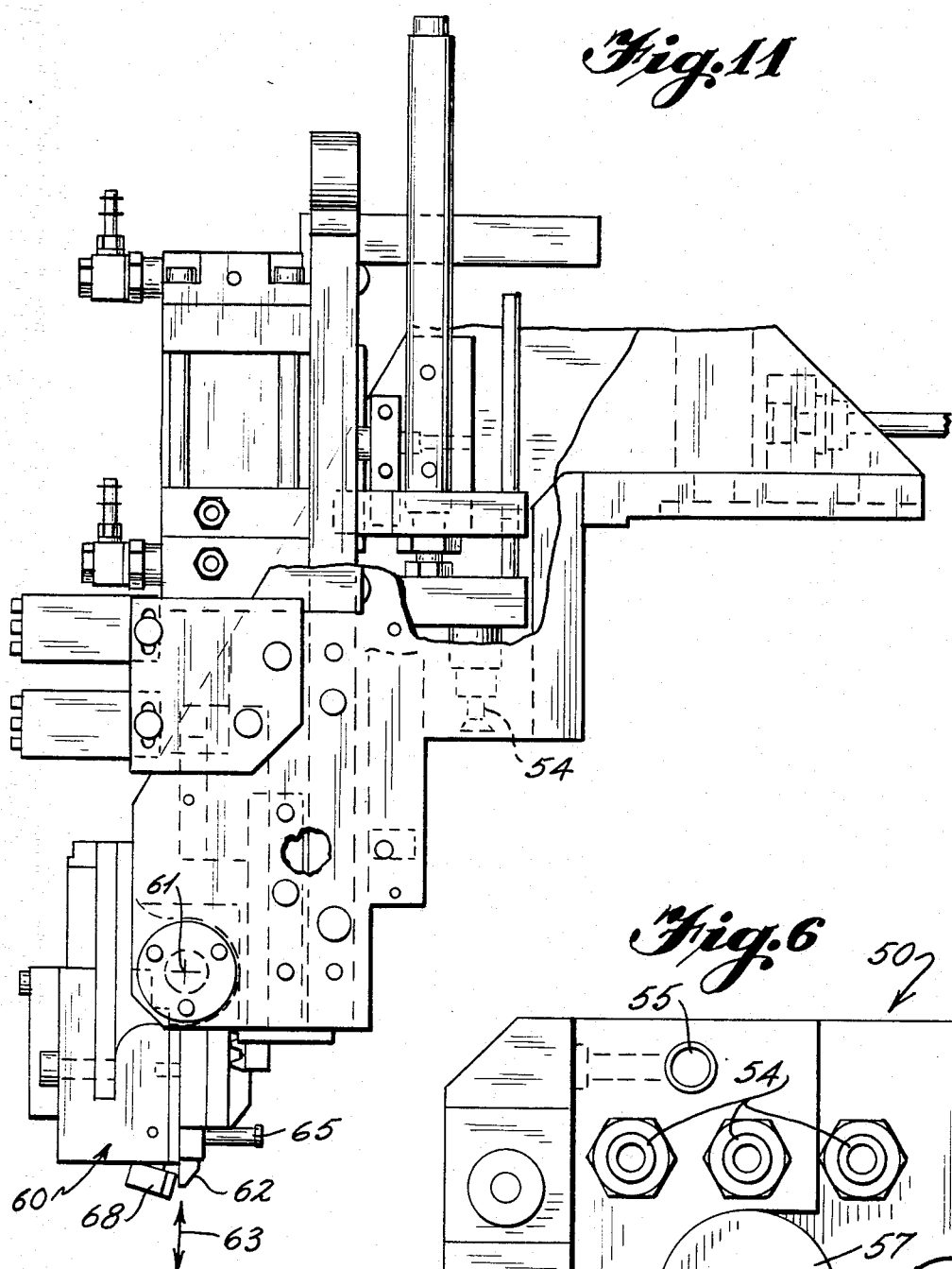
FIG. 11 is a right side elevation of the device of FIG. 10, with parts thereof broken away for clarity.
Figure 11A:
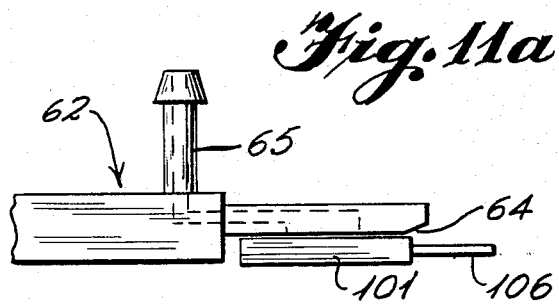
FIG. 11A is a partial, enlarged view of the insert head vacuum block to illustrate a beveled component engaging portion.

FIGS. 10 and 11 illustrate an insert head assembly similar to that disclosed in the above cross-referenced U.S. Pat. No. 4,327,483. An insert head 60 is pivotal about axis 61 and comprises a vacuum block 62 which is extensible and retractable in the direction of arrows 63 of FIG. 11. Referring to FIG. 11A, vacuum block 62 has a vacuum hose attachment 65 and a tapered surface 64 for purposes which will become apparent from the following description of the operation of the overall apparatus. Insert head 60 also comprises a clamp assembly 66 (FIGS. 10–13) for clamping the body of a SIP against vacuum block 62. Clamp assembly 66 has a clamp member 68 pivotal about axis 67 and biased to the unclamped position of FIG. 13 by compression spring 70. Actuation cylinder 72 has a piston rod 74 to the end of which is attached a hardened steel nose piece 76 for engaging clamp member 68 and pivoting it to the clamping position against the biasing of spring 70.

OPERATION OF A PREFERRED EMBODIMENT

The generalized sequence of operation involves movement of Shuttle assembly 80 to a selected magazine 90, extraction of a SIP 102 from the magazine and transport of SIP 102 to a position underneath vertical transfer assembly 50. SIP 102 is engaged by one or more vacuum tubes 54 of vertical transfer assembly 50 (according to the length of body 101) for removing SIP 102 from Shuttle 80 and transferring it downwardly to horizontal surface 38 of testing station 10. At testing station 10, side clamp cylinder 32 is actuated to engage body 101 of SIP 102 and force it against locator surfaces 40 such that the leads 106 of SIP 102 are properly located relative to lead straightening holes 26 of tester station 2. At this time, vertical transfer vacuum tubes 54 are retracted, insert head 60 pivots to position the tooling thereof in a horizontal position, and vacuum block 62 of insert head 60 is extended into engagement with SIP 102 while slide 20 is moved to a first extended position by cylinder 16 such that leads 106 are guided into straightening holes 26 by lead-in portion 26' of straightener/aligner block 25 and body 101 of SIP 102 is sandwiched between vacuum block 62 and straightener/aligner block 25. The front portion of vacuum block 62 is beveled so that body 101 of SIP 102 is firmly engaged against horizontal surface 38, without damage, if the body 101 was not already fully engaged with surface 38. The tips of straightened leads 106 engage flexible leaf-spring contacts 24 which are located behind block 25 (as seen in FIG. 14). Having straightened leads 106 and tested the electrical functioning of SIP 102 via leads 106 thereof, side clamp 34 is retracted, and slide 20 is extended along with retraction of vacuum block 102 (generally in the direction of axis 13) to transfer SIP 102 away from test station 10. Thereafter clamping cylinder 72 is actuated, such that pivotal clamp 68, engages body 101 of SIP 102 to clamp SIP 102 onto vacuum block 62, and slide 20 is fully retracted. At this time, insert head 60 is pivoted to position the tooling thereof in the vertical position of FIG. 1, with the body of SIP 102 sandwiched between vacuum block 62 and pivotal clamp 68, then clamp 68 is pivoted out of engagement with SIP body 101, and insert head 60 is actuated to insert leads 106 of SIP 102 into corresponding holes of a printed circuit board.

A specific operation of the apparatus is described in the steps:

(1) Shuttle 80 moves to a selected magazine 90 with the tooling thereof pivoted downwardly and partially extended;

(2) the tooling of Shuttle assembly 80 fully extends;

(3) the tooling of Shuttle assembly 80 raises;

(4) retriever 82 retracts to extract SIP 102 from magazine 90 and clamp the body thereof between retriever 82 and clamp 84 under the bias of spring 86;

(5) the tooling of Shuttle assembly 80 is lowered and a check is performed for the presence or absence of a component in the tooling. If the check is negative, three more attempts are initiated to retrieve a component from the selected magazine or an alternative magazine. If, after the three attempts, no component has been retrieved by the tooling of Shuttle assembly 80, then the machine is stopped and the operator is notified by an alarm. If the check for a component is positive; then (6) shuttle 80 moves to a position adjacent vertical transfer assembly 50;

(7) the tooling of Shuttle assembly 80 is extended and the vacuum of transfer assembly 50 is turned on;

(8) the tooling of Shuttle assembly 80 is raised to contact the body 101 of SIP 102 with vacuum head 56 of vertical transfer assembly 50;

(9) retriever 82 of Shuttle assembly 80 is further extended to unclamp the SIP, a piezoelectric transducer-type vacuum switch senses whether or not a SIP is supported by vacuum head 56 of vertical transfer assembly 50, and a "part missing" function similar to that described above is performed if a component is not supported by vacuum head 56. If a component is supported by vacuum head 56; then

(10) the tooling of Shuttle assembly 80 is lowered; and

(11) shuttle 80 moves to the next selected magazine 90.

The above described steps (3–11) are repeated in concert with the following steps (12–20).

(12) Vacuum tubes 54 of vertical transfer assembly 50 are extended downwardly;

(13) side clamp cylinder 32 of test station 10 is extended, and the vacuum of vertical transfer assembly 50 is turned off. Hall effect sensor 44 will be actuated if a SIP 102 is not appropriately captured between clamp block 34 and locator surface 40. With SIP 102 appropriately captured by extension of side clamp block 34;

(14) vacuum tubes 54 of vertical transfer assembly are retracted and the tooling of insert head assembly 60 is rotated to the horizontal position indicated in phantom lines in FIG. 1;

(15) vacuum block 62 of the insert head is extended;

(16) slide 20 of test station 10 is extended to a first position such that leads 106 of SIP 102 are guided into straightening holes 26 and electrical functioning of SIP 102 is performed (through leads 106 via flexible leaf contacts 24 and associated circuitry). The vacuum of vacuum block 62 is turned on;

(17) side clamp block 34 is retracted;

(18) the pressure under which vacuum block 62 has been extended is lowered, and slide 20 is further extended to a second position so that SIP 102 clears horizontal surface 38 of the test station 10;

(19) clamp 68 of clamping assembly 66 is pivoted into engagement with body 101 of the SIP 102, which is being held by the vacuum on vacuum block 62 and by the sandwiching of body 101 between vacuum block 62 and straightening/aligning block 25 of slide 20;

(20) slide 20 is retracted. During this retraction of slide 20, leads 106 remain parallel to each other during the sliding disengagement thereof from holes 26 of block 25. If, for some reason, leads 106 are not exactly perpendicular to the surface of the body 101 from which they protrude, it will not matter since the tips of the parallel leads will be equally spaced and located relative to holes 26 of block 25 which, in the fully retracted position of block 25, are reference locations for positioning the corresponding circuit board holes beneath insert head 60. Thus, the tips of leads, 106 if not the full lengths of the leads, will be properly positioned relative to the corresponding circuit board holes into which they are to be inserted. If the test results have been negative, i.e., all the leads have not been straightened and tested or electrical functioning of SIP 102 is unsatisfactory, then the component will be removed from vacuum block 62 such that a faulty component will not be mounted on the circuit board.

During the next three steps (21–23), the above described steps (3–5) and (12–14) are performed in conjunction therewith.

(21) Insert head 60 is pivoted to the insert position, while the printed circuit board is properly positioned and a clinching mechanism under the printed circuit board is opened to receive leads 106 of SIP 102.

(22) Clamp 68 is pivoted away from SIP 102 such that only vacuum block 62 is holding SIP 102.

(23) The insert head is extended to insert leads 106 into the corresponding holes of the circuit board, and clinching of the leads to the underside thereof is performed.

Testing of the component for electrical functioning should be understood to include testing for proper orientation of the component.

Typically during straightening and testing, vacuum block 62 is extended with 80 pounds of fluid pressure while slide 20 is extended with 10 pounds of fluid pressure; whereas, during transfer of the SIP from the test station, 20 pounds of extension pressure is applied to vacuum block 62 and 60 pounds to slide 20. It has been found that these pressures prevent breakage of the stand-offs of the components.

In cases where the component bodies 101 vary in thickness, from component to component, the lead straightening operation may cause all of the leads 106 to be parallel to each other but not perpendicular to the surface of body 101 from which they protrude. In fact, because of manufacturing inconsistencies, a body 101 may vary in thickness from end to end, causing a similar situation where the leads 106 are parallel to each other and not perpendicular to the body surface. However, by the instant invention, the tips of the straightened leads still will be located properly for subsequent insertion when either of these situations occur.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Now that the invention has been described, what is claimed as new and desired to be secured by Letters Patent is:

1. An automated method of sequentially handling electrical components of the type having a body and a single row of in-line leads projecting from said body, each of said leads having a longitudinal axis said method comprising the steps for each of said components of:
   mechanically straightening each of said leads which is bent along said axis while aligning said leads substantially parallel to each other in a row; and
   testing electrical functioning of said component substantially simultaneously with said straightening and aligning.

2. A method as in claim 1, and further comprising the step of:
   locating tips of said leads during said aligning as a reference for subsequent insertion of said leads into corresponding holes of a circuit board.

3. A method as in claim 1, and further comprising the step of:
   guiding tips of said leads during said aligning.

4. A method as in claim 2, and further comprising the steps of:
   rejecting said component when a selected tolerance range is exceeded during said testing; and
   inserting said leads into said circuit board holes when said selected tolerance range is not exceeded during said testing.

5. An automated method of sequentially handling electrical components having a body and leads projecting from said body, each of said leads having a lead axis, and comprising the steps for each of said components of:
   straightening each of said leads which are bent along said axis while aligning said leads parallel to each other; and
   testing electrical functioning of said component substantially simultaneously with said straightening and aligning.

6. An apparatus for performing an automated method of sequentially handling electrical components of the type having a body and a single row of in-line leads projecting from said body, each of said leads having a longitudinal axis, said apparatus comprising:
   means for straightening each of said leads which is bent along each axis while mechanically aligning said leads substantially parallel to each other in a row; and
   means, operatively associated with said straightening and aligning means, for testing electrical functioning of said component substantially simultaneously with said straightening and aligning.

7. An apparatus as in claim 6, and further comprising:
   means, operatively associated with said aligning means, for locating tips of said leads during said aligning as a reference for subsequent insertion of said leads into corresponding holes of a circuit board.

8. An apparatus as in claim 6, and further comprising:
   means, operatively associated with said aligning means, for guiding tips of said leads during said aligning.

9. An apparatus as in claim 7, and further comprising
   means, operatively associated with said testing means, for rejecting said component when a selected tolerance range is exceeded during said testing; and
   means, operatively associated with said testing means, for inserting said leads into said holes when said selected tolerance range is not exceeded during said testing.

10. An apparatus for performing an automated method of sequentially handling electrical components having a body and leads projecting from said body, each of said leads having a lead axis, said apparatus comprising:
    means for straightening and aligning said leads substantially parallel to each other each of said leads which are bent along each axis; and
    means, operatively associated with said straightening and aligning means, for testing electrical functioning of said component substantially simultaneously with said straightening and aligning.

11. An apparatus as in claim 6, and further comprising:
    means, operatively associated with said aligning means, for transporting a selected component to a test station which said straightening, aligning and testing is performed;
    means, operatively associated with said testing means, for transfe ring said component from said test station, upon completion of said testing, and inserting said leads into corresponding holes of a circuit board; and
    means for controlling, and operatively associated with, said transporting means and said transferring means.

12. An apparatus as in claim 11, wherein said transporting means comprises:
    shuttle means for moving said component from a shuttle load station to a shuttle unload station; and
    vertical transfer means for unloading said component from said shuttle means and loading said component into said test station.

13. An apparatus as in claim 11, wherein said transferring means comprise:
    a gauge block of said test station and a vacuum block of an insert head, said gauge block and said vacuum block moving in concert, with said component body sandwiched therebetween, during said transferring of said component from said test station.

14. An apparatus as in claim 13, and further comprising:
    means for engaging and clamping said component body onto said vacuum block in order to prevent loss of said component during return of said gauge block to said test station and during subsequent pivoting of said vacuum block to an insert position.

* * * * *